(12) United States Patent
Chen

(10) Patent No.: US 9,203,256 B2
(45) Date of Patent: Dec. 1, 2015

(54) CHARGE TRANSFER CIRCUIT

(71) Applicant: FUJITSU LIMITED, Kawasaki-shi, Kanagawa (JP)

(72) Inventor: Yanfei Chen, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 206 days.

(21) Appl. No.: 14/151,959

(22) Filed: Jan. 10, 2014

(65) Prior Publication Data

US 2014/0125294 A1    May 8, 2014

Related U.S. Application Data

(63) Continuation of application No. PCT/JP2011/066717, filed on Jul. 22, 2011.

(51) Int. Cl.
| | |
|---|---|
| H01M 10/46 | (2006.01) |
| H02J 7/00 | (2006.01) |
| G11C 19/18 | (2006.01) |
| G11C 19/28 | (2006.01) |
| H03H 19/00 | (2006.01) |
| H04N 5/357 | (2011.01) |
| H04N 5/372 | (2011.01) |
| G11C 27/02 | (2006.01) |

(52) U.S. Cl.
CPC ............ *H02J 7/0054* (2013.01); *G11C 19/184* (2013.01); *G11C 19/28* (2013.01); *H03H 19/004* (2013.01); *G11C 27/024* (2013.01); *H04N 5/357* (2013.01); *H04N 5/372* (2013.01)

(58) Field of Classification Search
CPC ........ H02J 7/0016; H02J 7/0054; H02J 7/345

USPC .......................................... 320/107, 166, 167
See application file for complete search history.

(56) References Cited

U.S. PATENT DOCUMENTS

| | | | |
|---|---|---|---|
| 2003/0227405 A1* | 12/2003 | Nakamoto | ............ H03M 1/165 341/156 |
| 2007/0279507 A1 | 12/2007 | Anthony | |

FOREIGN PATENT DOCUMENTS

| | | |
|---|---|---|
| JP | S58-154261 A | 9/1983 |
| JP | S59-21059 A | 2/1984 |
| JP | 2009-539324 A | 11/2009 |
| JP | 2010-34890 A | 2/2010 |

(Continued)

OTHER PUBLICATIONS

International Preliminary Report on Patentability dated Jan. 28, 2014 for corresponding to PCT/JP2011/066717, 9 pages.

(Continued)

*Primary Examiner* — Edward Tso
(74) *Attorney, Agent, or Firm* — Fujitsu Patent Center

(57) ABSTRACT

A charge transfer circuit has a charge transfer unit including an input charge holding element holding an input charge, an output charge holding element holding an output charge, and a charge transfer element, provided between a first node of the input charge holding element and a second, node of the output charge holding element, to transfer the charge held by the input charge holding element to the output charge holding element, an error sensing circuit detecting a third voltage corresponding to a first voltage of the first node when the charge transfer element finished transferring the charge from the input charge holding element to the output charge holding element, and an error correction unit correcting a second voltage of the second node when the charge transfer finished based on the third voltage and eliminate an error included in the second voltage of the second node.

9 Claims, 12 Drawing Sheets

(56) References Cited

FOREIGN PATENT DOCUMENTS

| | | | |
|---|---|---|---|
| JP | 2011-159365 A | 8/2011 | |
| WO | WO 2007/143074 A2 | 12/2007 | |

OTHER PUBLICATIONS

International Search Report, mailed in connection with PCT/JP2011/066717 and mailed on Oct. 25 2011.

* cited by examiner

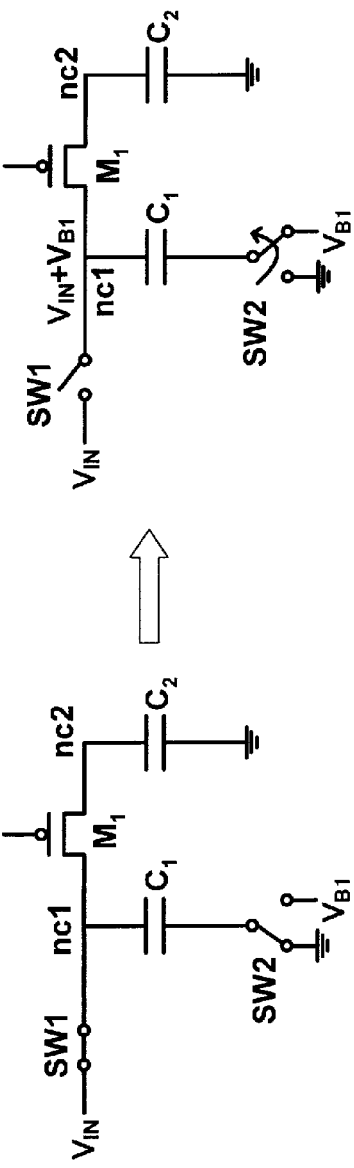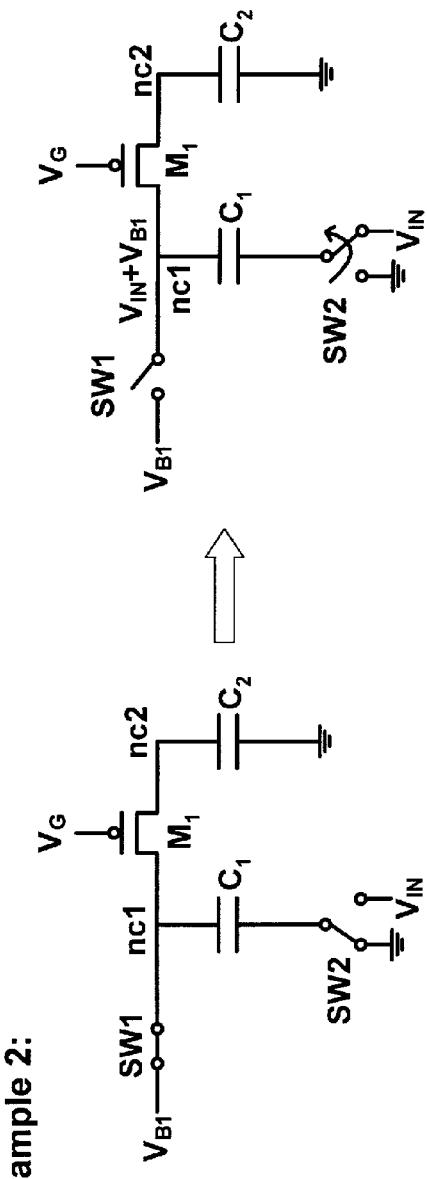
FIG. 9

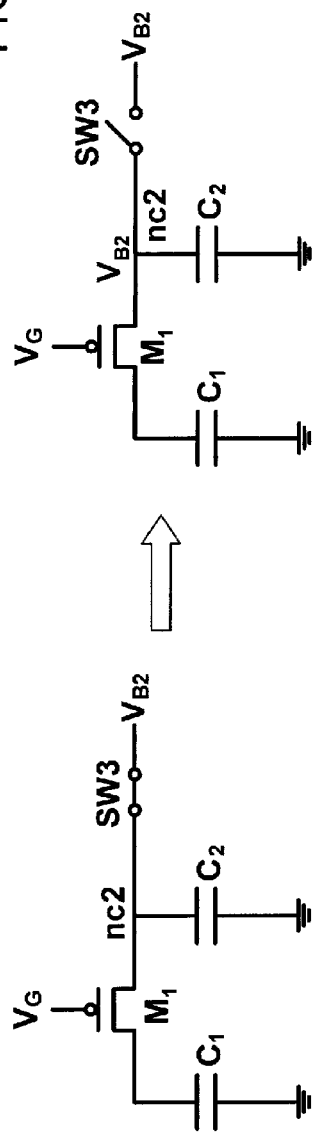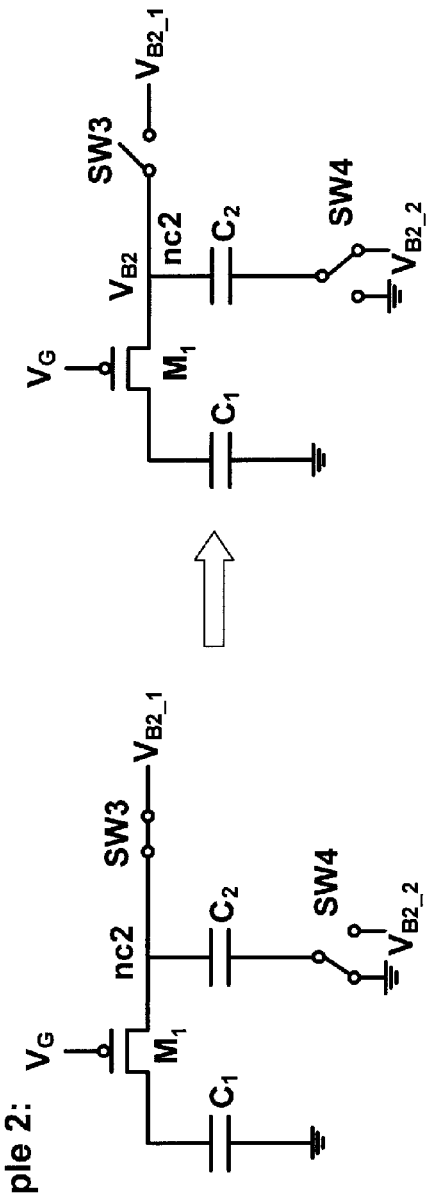
FIG. 10

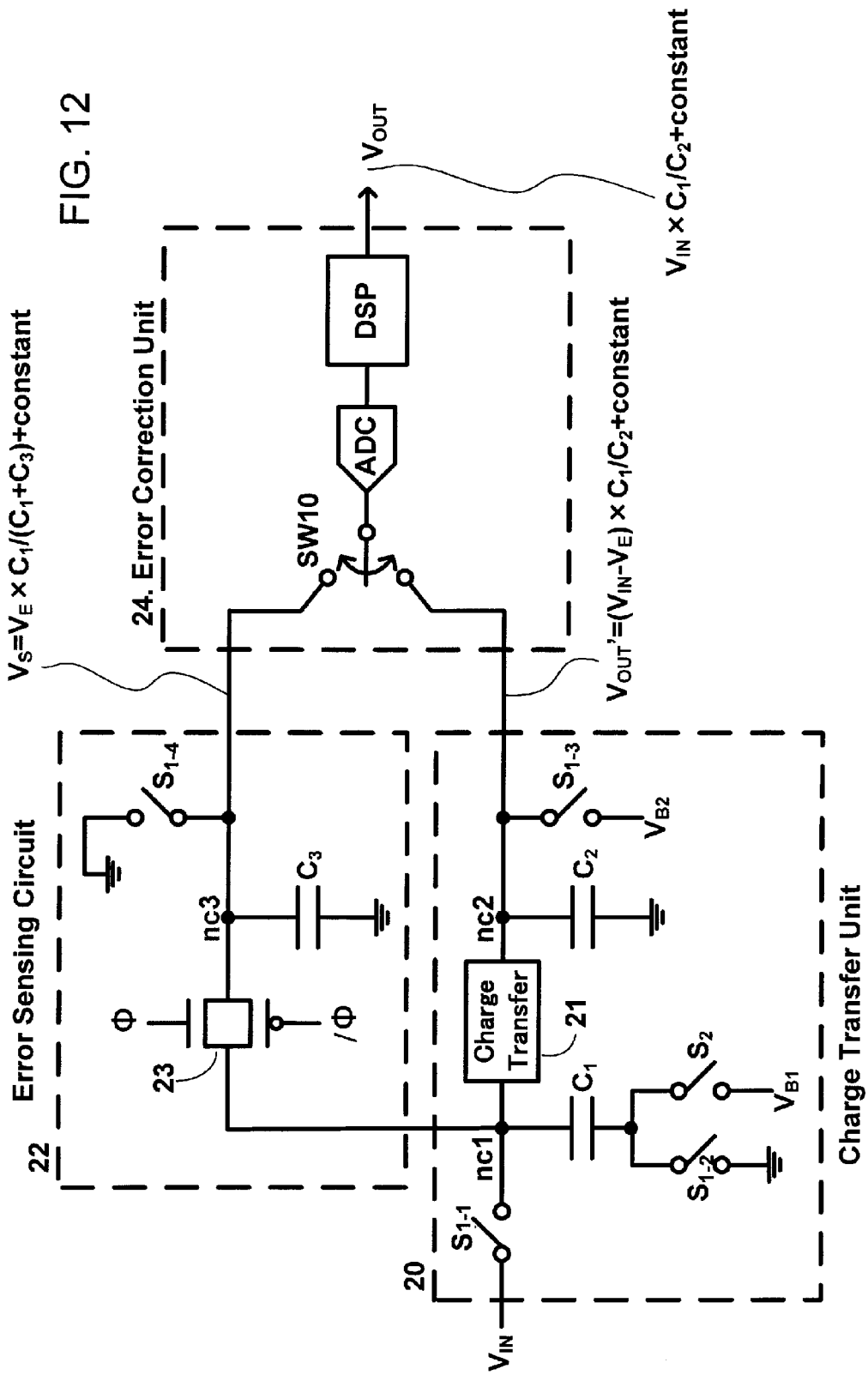

CHARGE TRANSFER CIRCUIT

CROSS-REFERENCE TO RELATED APPLICATION

This application is a continuation application of International Application PCT/JP2011/066717 filed on Jul. 22, 2011 and designated the U.S., the entire contents of which are incorporated herein by reference.

FIELD

The present invention relates to a charge transfer circuit.

BACKGROUND

A charge transfer circuit transfers charge indicating as analog quantity from an input charge holding element to an output charge holding element through a charge transfer element. The charge transfer circuit is a kind of charge region signal processing circuit and transfers a charge packet indicating an analog quantity. The charge region signal processing circuit includes a charge coupled device (CCD), a charge transfer circuit of the present application that transfers charge using transistors, and the like, for example.

The charge transfer circuit applies an input voltage to an input charge holding element so that charge is held by the input charge holding element and transfers an input charge holding element from the input charge holding element to an output charge holding element through a charge transfer element. The output voltage of the output charge holding element is a voltage that is a multiplication of an input voltage and a capacitance ratio of the input and output charge holding elements.

The charge region signal processing circuit of the charge transfer circuit and the like is disclosed in Japanese Patent Application Publication No. 2009-539324 and Japanese Patent Application Publication No. 2010-34890.

SUMMARY

Japanese Patent Application Publication No. 2009-539324 discloses a charge transfer circuit that transfers charge corresponding to an input voltage from an input charge holding element to an output charge holding element based on a threshold voltage of a transistor which is a charge transfer element and also discloses a charge transfer circuit that transfers charge corresponding to an input voltage from an input charge holding element to an output charge holding element using a differential amplifier.

However, a threshold voltage of a transistor fluctuates depending on a process condition and also fluctuates depending on a power supply voltage in an operation state or an operating temperature. Due to this, the amount of transferred charge has an error corresponding to a fluctuation of the threshold voltage and the accuracy of the charge transfer circuit decreases. Moreover, when the charge is transferred using a differential amplifier, the differential amplifier has an offset voltage, the amount of transferred charge has an error corresponding to a fluctuation of the offset voltage, and the accuracy of the charge transfer circuit also decreases.

One aspect of an embodiment is a charge transfer circuit comprising:

a charge transfer unit including an input charge holding element that is configured to hold an input charge, an output charge holding element that is configured to hold an output charge, and a charge transfer element that is provided between a first node of the input charge holding element and a second node of the output charge holding element and is configured to transfer the charge held by the input charge holding element to the output charge holding element;

an error sensing circuit being configured to detect a third voltage corresponding to a first voltage of the first node when the charge transfer element finished transferring the charge from the input charge holding element to the output charge holding element; and an error correction unit being configured to correct a second voltage of the second node when the charge transfer finished based on the third voltage and eliminate an error included in the second voltage of the second node.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 9 is a diagram illustrating an example of a preset circuit of the first node nc1.

FIG. 10 is a diagram illustrating an example of a preset circuit of the second node nc2.

FIG. 12 is a diagram illustrating a modification of a charge transfer circuit according to the present embodiment.

DESCRIPTION OF EMBODIMENTS

Figure 1:
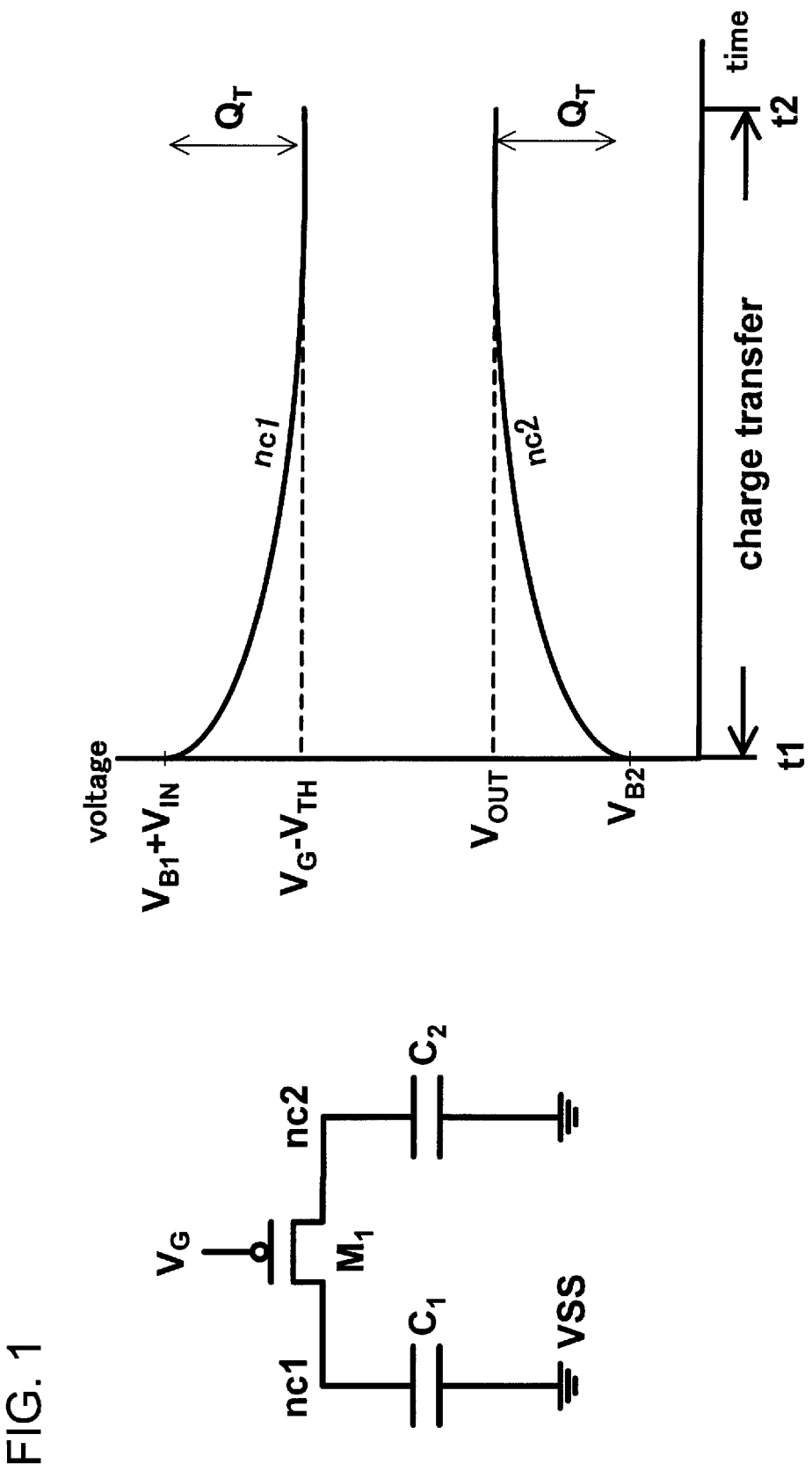
FIG. 1 is a diagram illustrating a charge transfer circuit and a charge transfer operation thereof.

FIG. 1 is a diagram illustrating a charge transfer circuit and a charge transfer operation thereof. The charge transfer circuit of FIG. 1 includes an input charge holding element $C_1$ that holds an input charge, an output charge holding element $C_2$ that holds an output charge, and a charge transfer element $M_1$ that is provided between a first node nc1 of the input charge holding element $C_1$ and a second node nc2 of the output charge holding element $C_2$ so as to transfer the charge held by the input charge holding element $C_1$ to the output charge holding element $C_2$. In the example of FIG. 1, the input and output charge holding elements $C_1$ and $C_2$ are capacitors and the charge transfer element $M_1$ is a P-channel MOS transistor (PMOS transistor).

A charge transfer operation is illustrated on the right of FIG. 1, in which the horizontal axis corresponds to time and the vertical axis corresponds to voltage. In the charge transfer circuit, at the start moment of charge transfer t1, for example, a voltage $V_{IN}+V_{B1}$ which is the sum of an input voltage $V_{IN}$ and an input bias voltage $V_{B1}$ is applied to the first node nc1 and an output bias voltage $V_{B2}$ is applied to the second node nc2. Although switches for applying voltages to the first and second nodes nc1 and nc2 are provided for this to be realized, the switches are not illustrated in FIG. 1. A charge transfer voltage $V_G$ is applied to the gate of the PMOS transistor $M_1$ at the start moment of charge transfer t1, and the charge transfer voltage $V_G$ is maintained during the charge transfer period t1 to t2.

Charge transfer occurs when the following two requirements are satisfied.

(1) The first requirement is that the voltage (potential) of the first node nc1 is higher than the voltage (potential) of the second node nc2 during charge transfer.

(2) The second requirement is that the voltage $V_{IN}+V_{B1}$ of the first node nc1 at the start moment t1 of charge transfer is higher than a voltage $V_G-V_{TH}$ (that is, $(V_{IN}+V_{B1})>(V_G-V_{TH})$).

$V_{TH}$ in the second requirement is a threshold voltage of the PMOS transistor $M_1$, and in the case of PMOS, is generally smaller than 0 ($V_{TH}<0$). When the voltage of the first node nc1 is higher than the voltage $V_G$ of the gate by the threshold voltage ($-V_{TH}$) or more, the PMOS transistor $M_1$ enters a conduction state.

That is, the charge transfer operation is performed until the voltage of the first node nc1 decreases from the voltage $V_{IN+VB1}$ at the start moment of charge transfer to the voltage $V_G-V_{TH}$ at which the PMOS transistor $M_1$ enters a non-conduction state. With the charge transfer, the output charge holding element $C_2$ is charged, and the voltage $V_{B2}$ at the start moment of charge transfer of the second node nc2 rises to an output voltage $V_{OUT}$ at the end of charge transfer.

In this case, by the charge conservation law, the amount $Q_T$ of charge flowing out of the input charge holding element $C_1$ is equal to the amount $Q_T$ of charge flowing into the output charge holding element $C_2$, and the following relation is satisfied.

$$Q_T=[(V_{B1}+V_{IN})-(V_G-V_{TH})]\times C_1=(V_{OUT}-V_{B2})\times C_2$$

Thus, the output voltage $V_{OUT}$ is expressed as follows.

$$V_{OUT}=V_{IN}\times C_1/C_2+\text{constant} \quad \text{(Equation 1)}$$

Figure 2:
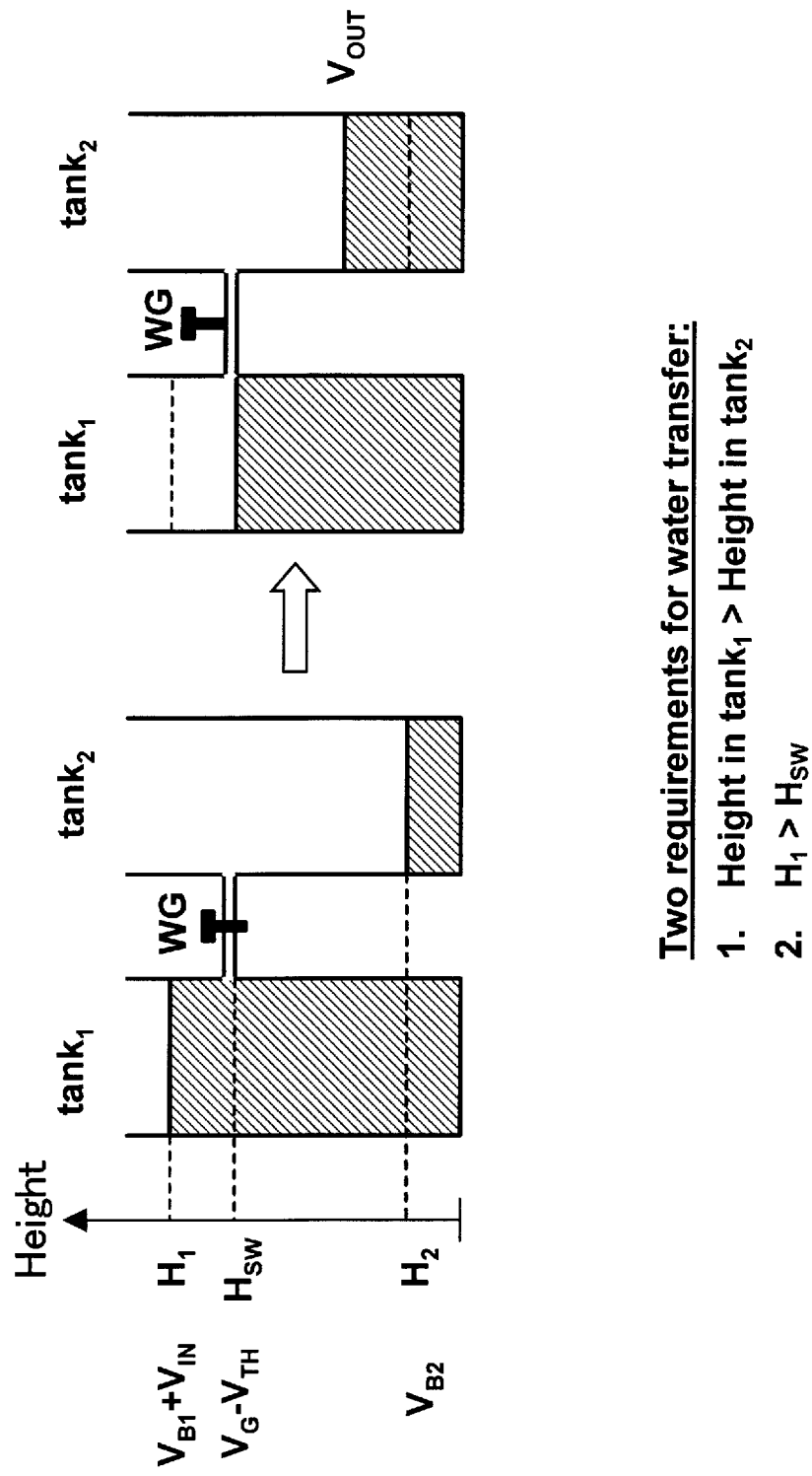
FIG. 2 is a diagram for describing the operation of the charge transfer circuit of FIG. 1.

FIG. 2 is a diagram for describing the operation of the charge transfer circuit of FIG. 1. FIG. 2 is an analogy of charge transfer by way of water transfer. Transfer of water in a source tank tank1 to a target tank tank2 through a water gate WG occurs when the following two requirements are satisfied.

(1) The first requirement is that the water heights $H_1$ and $H_2$ in both tanks during transfer satisfy $H_1>H_2$.

(2) The second requirement is that the water height $H_1$ in the tank tank1 at the start of transfer is higher than the water height $H_{SW}$ in the water gate WG ($H_1>H_{SW}$).

When the water gate WG is opened, the water in the source tank tank1 flows into the target tank tank2 until the water height $H_1$ reaches the water height $H_{SW}$ in the water gate WG.

In this case, the water heights and the respective voltages of FIG. 1 have the following relations.

$$H_1:V_{B1}+V_{IN}$$

$$H_{SW}:V_G-V_{TH}$$

$$H_2:V_{B2}$$

Final water height in tank2: $V_{OUT}$

Figure 3:
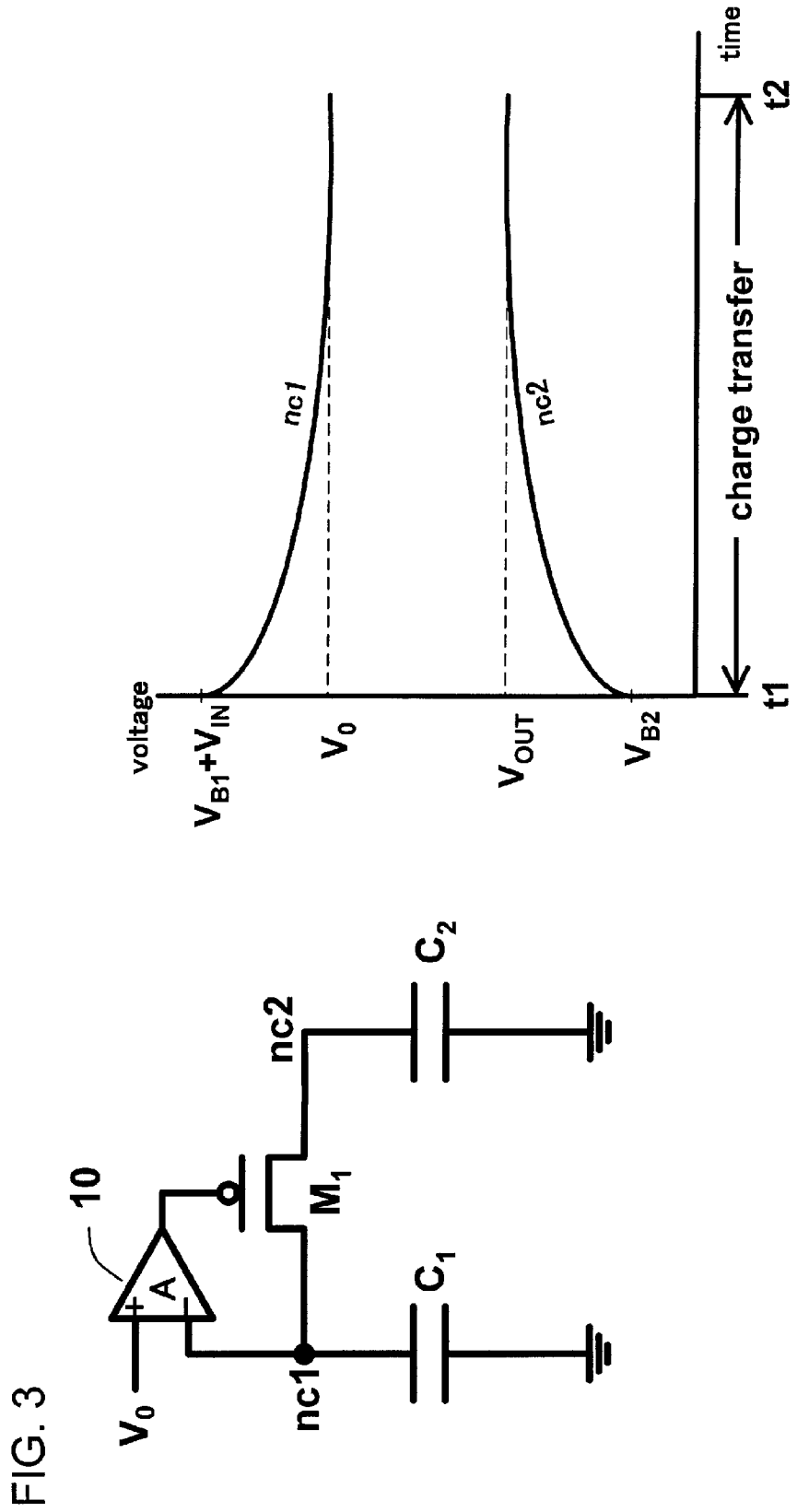
FIG. 3 is a diagram illustrating another charge transfer circuit and a charge transfer operation thereof.

FIG. 3 is a diagram illustrating another charge transfer circuit and a charge transfer operation thereof. Similarly to FIG. 1, the charge transfer circuit of FIG. 3 includes an input charge holding element $C_1$ that holds an input charge, an output charge holding element $C_2$ that holds an output charge, and a charge transfer element $M_1$ that is disposed between a first node nc1 of the input charge holding element $C_1$ and a second node nc2 of the output charge holding element $C_2$ so as to transfer the charge held by the input charge holding element $C_1$ to the output charge holding element $C_2$. In FIG. 3, both the input and output charge holding elements $C_1$ and $C_2$ are capacitors, and the charge transfer element $M_1$ is a P-channel MOS transistor (PMOS transistor).

The charge transfer circuit further includes an amplifier 10 that receives an input of the contestant voltage $V_0$ and first node nc1 voltage and supplies an output signal to the gate of the PMOS transistor $M_1$. When the voltage of the first node nc1 is higher than a constant voltage $V_0$, the amplifier 10 outputs an L-level output signal to put the PMOS transistor $M_1$ into a conduction state. Conversely, when the voltage of the first node nc1 is the constant voltage $V_0$ or smaller, the amplifier 10 outputs an H-level output signal to put the PMOS transistor $M_1$ into a non-conduction state.

A charge transfer operation is illustrated on the right of FIG. 3. In the charge transfer circuit, at the start moment of charge transfer t1, for example, a voltage $V_{IN}+V_{B1}$ which is the sum of an input voltage $V_{IN}$ and an input bias voltage $V_{B1}$ is applied to the first node nc1 and an output bias voltage $V_{B2}$ is applied to the second node nc2. For this to be realized, switches (not illustrated) are provided. Similarly to FIG. 1, charge transfer occurs when the following requirements are satisfied.

(1) The first requirement is that the voltage (potential) of the first node nc1 during charge transfer is higher than the voltage (potential) of the second node nc2.

(2) The second requirement is that the voltage $V_{IN}+V_{B1}$ of the first node nc1 at the start moment of charge transfer is higher than the constant: voltage $V_0$ (that is, $(V_{IN}+V_{B1})>V_0$)).

When the charge transfer starts at time t1, the voltage of the first node nc1 decreases from $V_{IN}+V_{B1}$. When the voltage of the first node nc1 reaches the constant voltage $V_0$, the PMOS transistor $M_1$ is turned off, and the charge transfer ends at time t2. In this case, the voltage of the second node nc2 is an output voltage $V_{OUT}$. By the charge conservation law, the amount $Q_T$ of transferred charge satisfies the following equation.

$$Q_T=(V_{B1}+V_{IN}-V_0)\times C_1=(V_{OUT}-V_{B2})\times C_2$$

$$V_{OUT}=V_{IN}\times C_1/C_2+\text{constant} \quad \text{(Equation 2)}$$

The output voltage $V_{OUT}$ of the charge transfer circuit of FIG. 1 illustrated in Equation 1 and the output voltage $V_{OUT}$ of the charge transfer circuit of FIG. 3 illustrated in Equation 2 have a value which is the sum of a constant and the input voltage $V_{IN}$ amplified by the capacitance ratio $C_2/C_1$ of the charge holding elements $C_1$ and $C_2$. That is, the charge transfer circuit transfers a voltage that is proportional to the input voltage $V_{IN}$.

Figure 4:
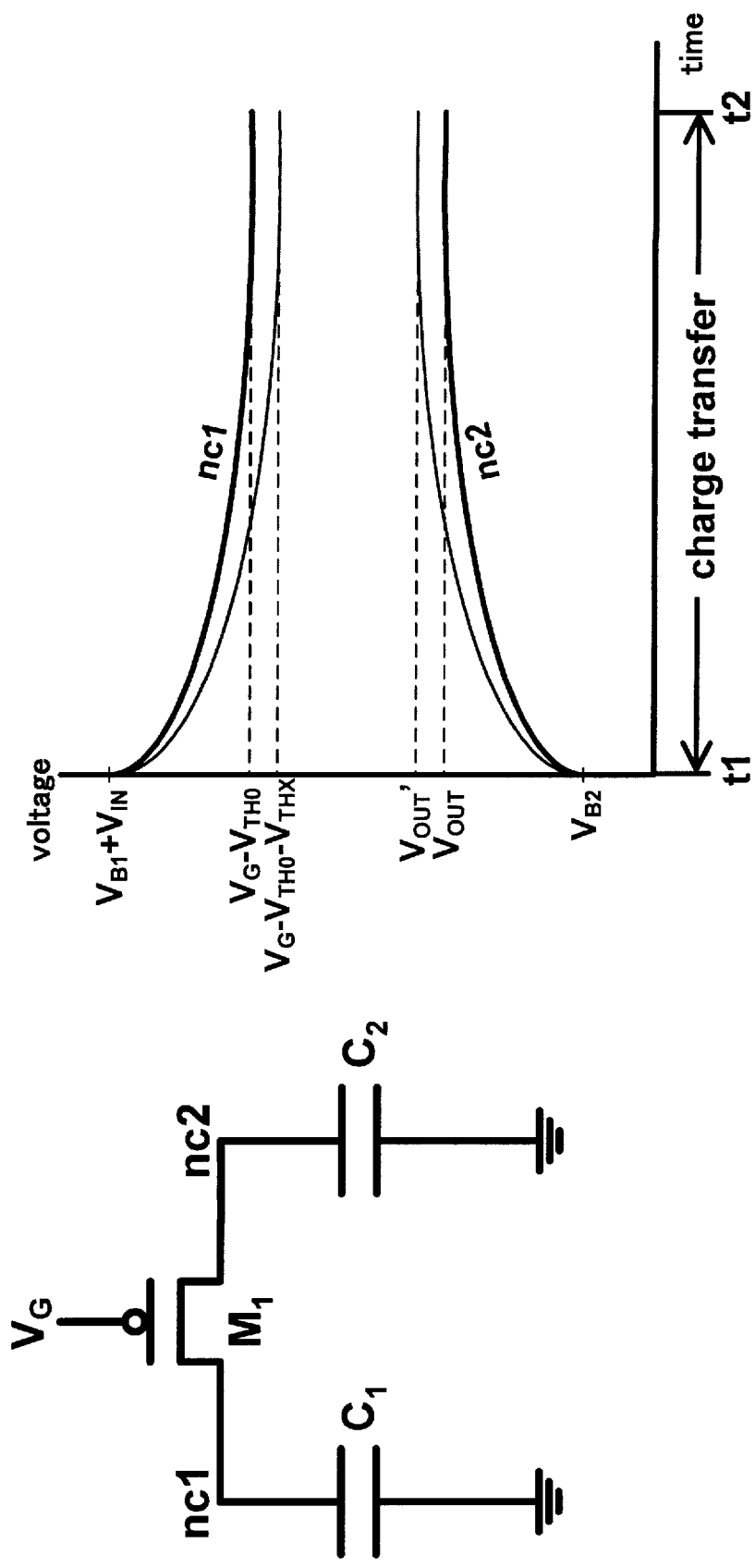
FIG. 4 is a diagram for describing an error in the output voltage of the charge transfer circuit of FIG. 1.

FIG. 4 is a diagram for describing an error in the output voltage of the charge transfer circuit of FIG. 1. In the case of the charge transfer circuit of FIG. 1, the voltage of the first node nc1 at the end of charge transfer is $V_G-V_{TH}$. The voltage $V_G-V_{TH}$ at the end of charge transfer is a voltage that determines the amount of transferred charge. However, the threshold voltage $V_{TH}$ of a transistor has a fluctuation that depends on a process condition (P) and also includes a fluctuation that depends on a power supply voltage (V) in an operation state or an operating temperature (T). Since the power supply voltage is used as a back-gate voltage of a MOS transistor, for example, a variation in the voltage is referred to as a variation in the threshold voltage $V_{TH}$ of the transistor.

FIG. 4 illustrates the charge transfer operation when the threshold voltage has an ideal value $V_{TH0}$ and the charge transfer operation when a fluctuation $V_{THX}$ resulting from process, voltage, and temperature (P,V,T) is added to the ideal value $V_{TH0}$. Although the ideal value $V_{TH0}$ is a fixed value, since the fluctuation $V_{THX}$ depends on P, V, and T, the fluctuation $V_{THX}$ is expressed as a function $V_{THX}=f(P, V, T)$. In FIG. 4, a bold line indicates the case of the ideal value $V_{TH0}$, and a narrow line indicates the case of the fluctuating threshold voltage $V_{TH0}+V_{THX}$. In the case of the ideal value $V_{TH0}$, the output voltage $V_{OUT}$ after charge transfer is expressed as illustrated in Equation 1.

On the other hand, in the case of threshold $V_{TH0}+V_{THX}$ exhibiting fluctuation, the output voltage $V_{OUT}'$ after charge transfer is expressed as below.

$$Q_T' = [(V_{B1}+V_{IN})-(V_G-V_{TH0}+V_{THX})] \times C_1 = (V_{OUT}'-V_{B2}) \times C_2$$

$$V_{OUT}'=(V_{IN}+V_{THX}) \times C_1/C_2 + \text{constant} \quad \text{(Equation 1A)}$$

That is, the output voltage $V_{OUT}'$ is not proportional to the input voltage $V_{IN}$ and both voltages are in a nonlinear relation.

Figure 5:
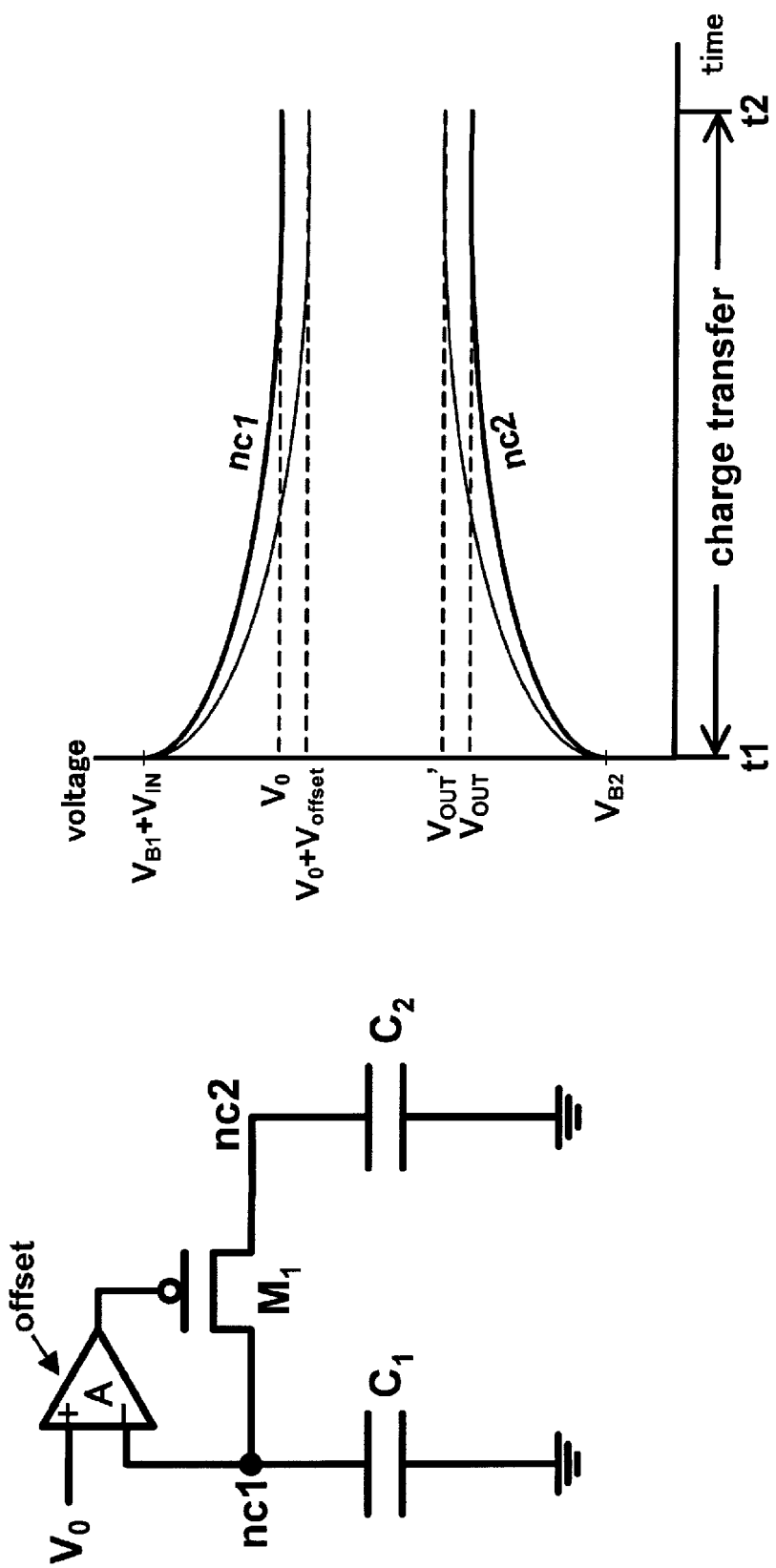
FIG. 5 is a diagram for describing an error in the output voltage of the charge transfer circuit of FIG. 3.

FIG. 5 is a diagram for describing an error in the output voltage of the charge transfer circuit of FIG. 3. In the case of the charge transfer circuit of FIG. 3, the voltage of the first node nc1 at the end of charge transfer is $V_0$. However, the amplifier 10 has an offset voltage $V_{offset}$. The causes of the offset voltage of the amplifier include a fluctuation in the threshold voltage of a transistor that constitutes an amplifier.

FIG. 5 illustrates the charge transfer operation when the amplifier 10 does not have the offset voltage $V_{offset}$ and the charge transfer operation when the amplifier 10 has the offset voltage $V_{offset}$. When the amplifier 10 has the offset voltage $V_{offset}$, when the voltage of the first node nc1 reaches a voltage $V_0+V_{offset}$ which is the sum of the offset voltage $V_{offset}$ and the constant voltage $V_0$, since the PMOS transistor $M_1$ is turned off, the voltage of the first node nc1 at the end of charge transfer t2 becomes $V_0+V_{offset}$. In FIG. 5, a bold line indicates the case where the offset voltage is zero and a narrow line indicates the case where the offset voltage is not zero. In the ideal case where the offset voltage is zero, the output voltage $V_{OUT}$ after charge transfer is expressed as Equation 2.

On the other hand, when the offset voltage $V_{offset}$ is not zero, the output voltage $V_{OUT}'$ after charge transfer is expressed as follows.

$$Q_T = [(V_{B1}+V_{IN})-(V_0-V_{offset})] \times C_1 = (V_{OUT}'-V_{B2}) \times C_2$$

$$V_{OUT}'=(V_{IN}-V_{offset}) \times C_1/C_2 + \text{constant} \quad \text{(Equation 2A)}$$

Further, in Equations 1A and 2A, when the capacitance ratio $C_1/C_2$ of the input charge holding element $C_1$ and the output charge holding element $C_2$ is increased, the errors $V_{THX}$ and $V_{offset}$ at the first node nc1 are increased by $C_1/C_2$ times, and the error included in the output voltage $V_{OUT}'$ of the second node nc2 increases further.

[Charge Transfer Circuit of Present Embodiment]

Figure 6:
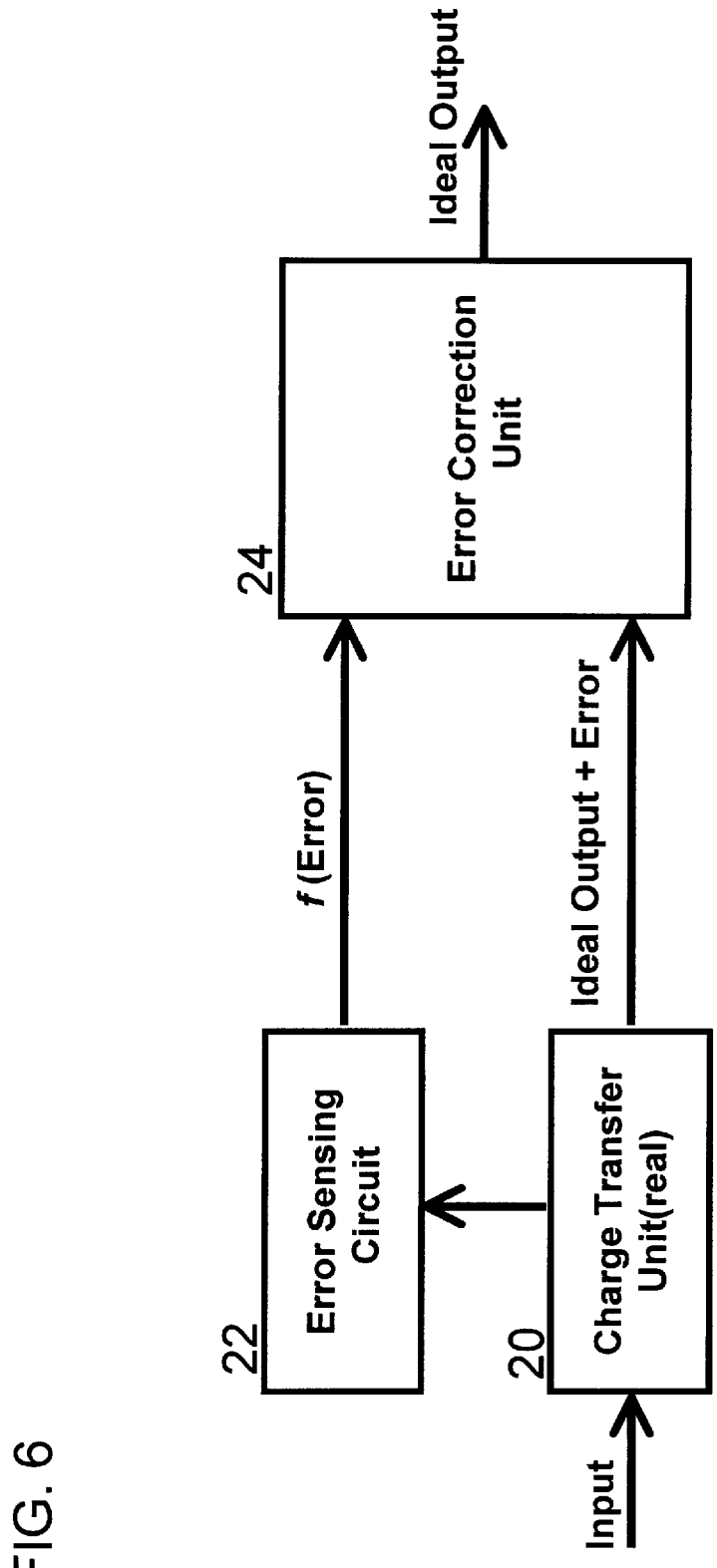
FIG. 6 is a schematic diagram of a charge transfer circuit of the present embodiment.

FIG. 6 is a schematic diagram of a charge transfer circuit of the present embodiment. The charge transfer circuit of FIG. 6 includes a charge transfer unit 20 that includes the charge transfer circuit illustrated in FIG. 1 and FIG. 3, an error sensing circuit 22 that detects a correction voltage corresponding to the voltage of the first node at the end of charge transfer, and an error correction unit 24 that corrects the voltage of the second node at the end of charge transfer based on the correction voltage to eliminate an error included in the output voltage of the second node. The correction voltage corresponding to the voltage of the first node, detected by the error sensing circuit 22 includes an error component included in the voltage of the first node. Thus, the error correction unit 24 eliminates the error component included in the output voltage of the second node based on the detected correction voltage.

Figure 7:
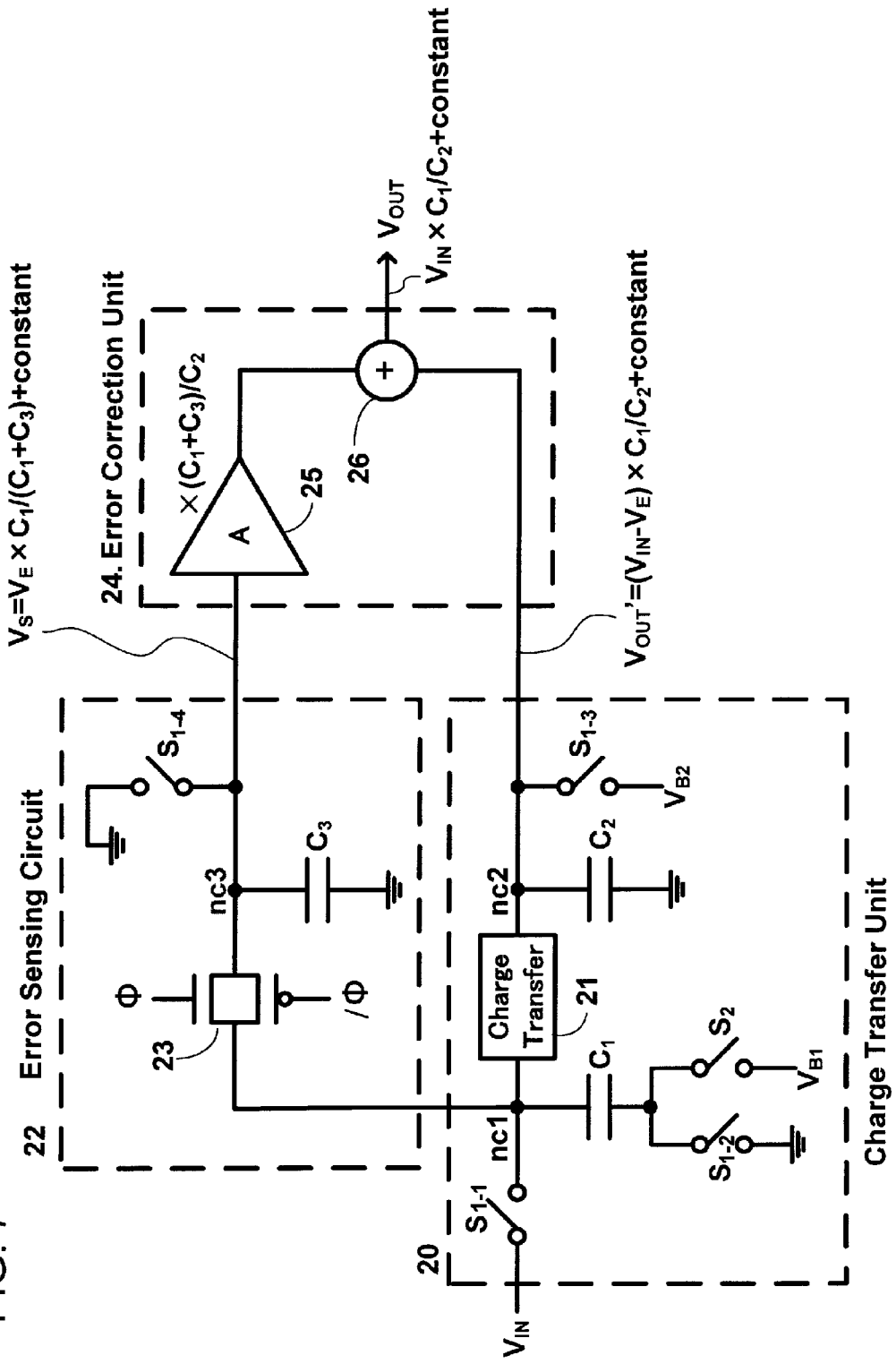
FIG. 7 is a diagram illustrating a charge transfer circuit according to a first embodiment.

FIG. 7 is a diagram illustrating a charge transfer circuit according to a first embodiment. The charge transfer unit 20 includes an input charge holding element $C_1$, an output charge holding element $C_2$, and a charge transfer element 21 provided between a first node nc1 of the input charge holding element $C_1$ and a second node nc2 of the output charge holding element $C_2$. A first example of the charge transfer element 21 is the PMOS transistor $M_1$ in which a voltage $V_G$ is applied to a gate thereof, illustrated in FIG. 1, and a second example thereof is the amplifier 10 and the PMOS transistor $M_1$ illustrated in FIG. 3. The charge transfer element 21 may be any one of the first and second examples.

The charge transfer unit 20 of FIG. 7 includes a switch $S_{1-1}$ that applies an input voltage $V_{IN}$ to the first node nc1, switches $S_{1-2}$ and $S_2$ provided in an electrode of the input-side capacitor $C_1$ opposite to the first node nc1 so as to apply a ground potential VSS or a bias voltage $V_{B1}$, and a switch $S_{1-3}$ provided in the second node nc2 of the output-side capacitor $C_2$ so as to apply a bias voltage $V_{B2}$. Among the respective switches, $S_{1-1}$-$S_{1-3}$ are switches which are turned on in a preset period of a charge transfer operation and is turned off during charge transfer, and $S_2$ is a switch which is turned off in the preset period and is turned on during the charge transfer operation.

For example, during the preset period, the switches $S_{1-1}$-$S_{1-3}$ are turned on, the input voltage $V_{IN}$ is applied to the first node nc1 of the input-side capacitor $C_1$, the ground potential VSS is applied to the electrode of the input-side capacitor $C_1$ opposite to the first node nc1, and charge corresponding to the input voltage $V_{IN}$ is stored in the input-side capacitor $C_1$. Similarly, during the preset period, the bias voltage $V_{B2}$ is applied to the second node nc2 of the output-side capacitor $C_2$, and charge corresponding to the bias voltage $V_{B2}$ is stored in the output-side capacitor $C_2$. Moreover, when the switch $S_{1-2}$ is turned off and the switch $S_2$ is turned on, the bias voltage $V_{B1}$ is applied to the electrode of the input-side capacitor $C_1$ and the voltage of the first node nc1 becomes $V_{IN+VB1}$. As a result, the charge transfer element 21 is turned on and performs charge transfer.

The error sensing circuit 22 of FIG. 7 includes a CMOS transfer gate 23, an error holding element $C_3$ that holds charge corresponding to an error voltage, and a switch $S_{1-4}$ that applies the ground potential VSS to a third node nc3 of the error holding element $C_3$. During the preset period, the switch $S_{1-4}$ is turned on and the third node nc3 is set to the ground potential VSS. When the charge transfer of the charge transfer unit 20 ends, the CMOS transfer gate 23 enters a conduction state and a voltage corresponding to the voltage of the first node nc1 is held in the error holding element $C_3$. When the CMOS transfer gate 23 enters the conduction state, since the error holding element $C_3$ of the input charge holding element $C_1$ is connected to the first and third nodes nc1 and nc3, the charge held by the input charge holding element $C_1$ is distributed by the capacitance ratio of both elements $C_1$ and $C_3$.

That is, the following relations are satisfied by the charge conservation law before and after the CMOS transfer gate 23 is turned on.

$$Vnc1 \times C_1 = Vnc3 \times (C_1+C_3)$$

$$Vnc3 = Vnc1 \times (C_1/(C_1+C_3))V_S$$

This voltage Vnc3 is the correction voltage $V_S$ detected by the error sensing circuit 22. Since the voltage Vnc1 of the first node nc1 includes an error component as described, later, the voltage Vnc3 of the third node nc3 also includes an error component $V_E$. Thus, it is possible to calculate the error component $V_E$ by an operation described later and to eliminate the error component $V_E$ from the output voltage $V_{OUT}'$ of the second node cn2 after charge transfer.

The transfer gate 23 is configured as a CMOS transistor in which a HMOS transistor and a PMOS transistor are connected in parallel so that, the transfer gate 23 enters a conduction state when the voltage across both source and drain terminals and the gate voltage have an optional relation. However, in the relation between the voltage across both source and drain terminals and the gate voltage, when the transfer gate 23 enters the conduction state when the control signal φ has the H level, the transfer gate 23 may be configured as only one of the NMOS transistor and the PMOS transistor, The error correction unit 24 of FIG. 7 corrects the voltage $V_{OUT}'$ of the second node nc2 at the end of charge transfer based on the correction voltage $V_S$ and eliminates the error $V_E$ included in the voltage $V_{out}'$ of the second node. In the example of FIG. 7, the error correction unit 24 is a circuit that includes an amplifier 25 that multiplies the error voltage $V_S$ by $(C_1+C_3)/C_2$ and an adder 26 that adds the output of the amplifier 25 and the output voltage $V_{OUT}'$ of the charge transfer unit 20. By the operation of multiplication and addition, the error component $V_E$ is eliminated from the output voltage $V_{OUT}'$.

Figure 8:
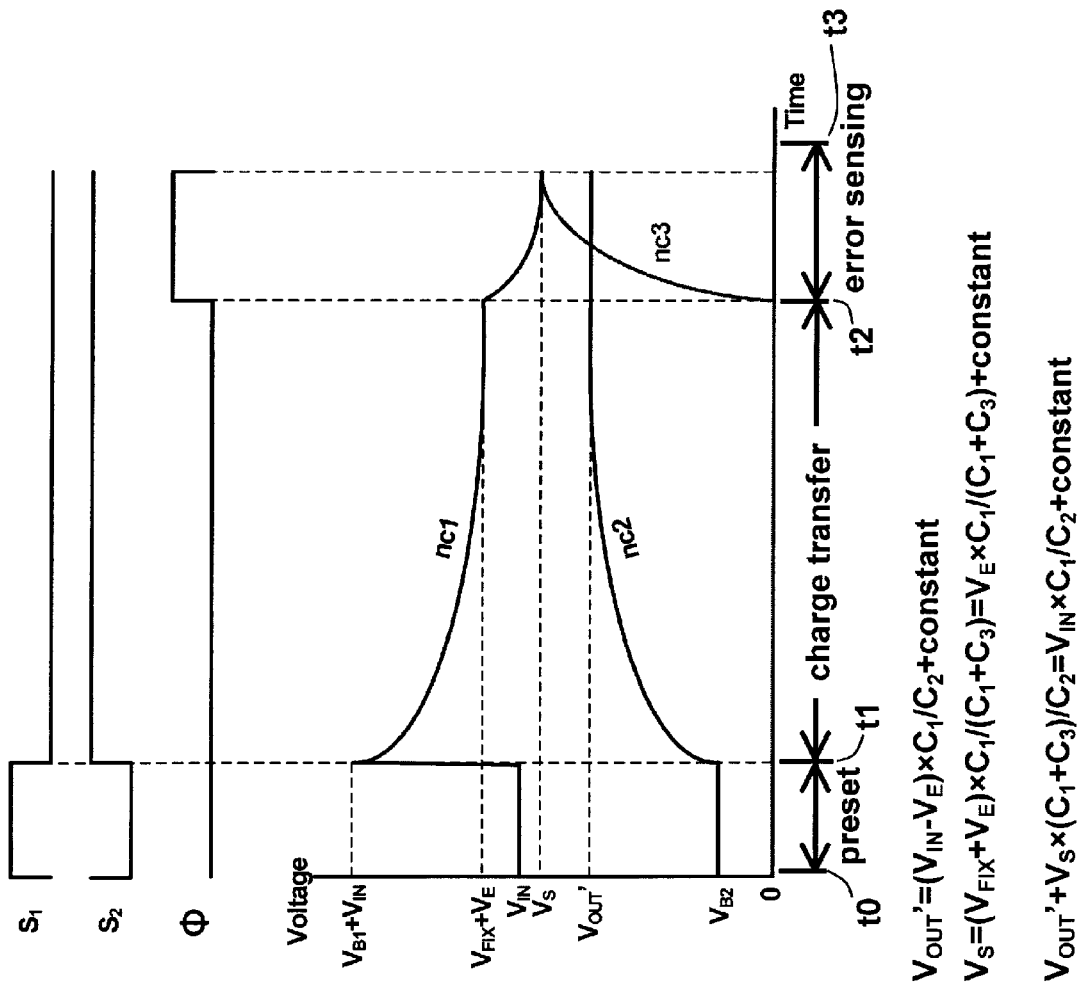
FIG. 8 is a diagram illustrating the operation of the charge transfer circuit of FIG. 7.

FIG. 8 is a diagram illustrating the operation of the charge transfer circuit of FIG. 7. In FIG. 8, the operation (H level: on, L level: off) of the switches $S_1$ ($S_{1-1}$–$S_{1-4}$) and $S_2$, the control signal φ (H level: on, L level: off) of the CMOS transfer gate 23, and variation in the voltages of the first, second, and third nods nc1, nc2, and nc3 are illustrated. On the horizontal axis, time t0 to t1 is a preset period, time t1 to t2 is a charge transfer period, and time t2 to t3 is an error sensing period.

First, in the preset period t0 to t1, the switches $S_1$ is turned on, the switch $S_2$ is turned off, the first node nc1 is set to the input voltage $V_{IN}$, the second node nc2 is set to the bias voltage $V_{B2}$, and the third node nc3 is set to the ground potential VSS. In the charge transfer start time t1, the switch $S_2$ is turned on, the switch $S_{1-2}$ is turned off, the bias voltage $V_{B1}$ is applied to an electrode of the input charge holding element $C_1$ opposite to the first node nc1, and the first node nc1 is set to $V_{IN}+V_{B1}$. In this case, the voltage of the second node nc2 is $V_{B2}$, and the voltage of the third node nc3 is VSS=0V.

Thus, before and after the time t1, the voltages have the following relation.

$V_{IN} < V_G - V_{TH} < V_{IN} + V_{B1}$ (the case of the charge transfer element $M_1$ of FIG. 1)

$V_{IN} < V_0 V_{IN} + V_{B1}$ (the case of the charge transfer element $M_1$ and the amplifier 10 of FIG. 3)

Here, if $V_G - V_{TH}$ or $V_0$ is a known fixed value $V_{FIX}$, the voltages have the following relation.

$V_{IN} < V_{FIX} < V_{IN} + V_{B1}$

However, the voltage $V_{FIX}$ includes an error $V_E$ due to a fluctuation in a threshold voltage or a fluctuation in an offset voltage.

That is, in the preset period t0 to t1, since $V_{IN} < V_{FIX}$, the PMOS transistor $M_1$ which is the charge transfer element 21 is turned off. In the charge transfer start time t1, when the switch $S_{1-2}$ is turned off, the switch $S_2$ is turned on, and the first node nc1 is set to $V_{IN} V_{B1}$, $V_{FIX} < V_{IN} + V_{B1}$, and the charge transfer element 21 enters a conduction state. Due to this, the charge in the input charge holding element $C_1$ flows toward the output charge holding element $C_2$ through the charge transfer element 21, the voltage (potential) of the first node nc1 decreases, and the voltage (potential) of the second node nc2 increases. When the voltage of the first node nc1 reaches $V_{FIX}+V_E$ at time t2, the PMOS transistor of the charge transfer element 21 is turned off, the voltage of the second node nc2 stops increasing, and the charge transfer ends. In this case, the voltage of the second node nc2 is $V_{OUT}'$. The voltage $V_{OUT}'$ of the second node nc2 is expressed below as Equations 1A and 2A described above.

$$V_{OUT}' = (V_{IN} - V_E) \times C_1/C_2 + \text{constant} \quad \text{(Equation 3)}$$

After the charge transfer ends at time t2, in the error sensing period t2 to t3, the control signal φ of the error sensing circuit 22 becomes the H level, the reversed control signal /φ becomes the L level, and the CMOS transfer gate 23 enters a conduction state. Due to this, the voltage $V_{FIX}+V_E$ of the first node nc1 is distributed by the capacitance ratio of the input charge holding element $C_1$ and the error charge holding element $C_3$, and the voltage $V_S$ of the third node nc3 (the same applies to the voltage of the first node nc1) is expressed as follows. Since $V_{FIX}$ is a fixed voltage, this voltage is included in the constant term.

$$V_S = (V_{FIX}+V_E) \times C_1/C_3) = V_E \times C_1/(C_1+C_3) + \text{constant} \quad \text{(Equation 4)}$$

The voltage $V_S$ in Equation 4 is a voltage that is a multiplication of the capacitance ratio $C_1/(C_1+C_3)$ and the voltage $V_{FIX}+V_E$ of the first node nc1 and a voltage corresponding to the voltage of the first node nc1, and is a correction voltage that includes the error $V_E$. Since $V_{FIX}$ and $C_1/(C_1+C_3)$ other than the voltage $V_E$ in Equation 4 are known values, the error $V_E$ is calculated from Equation 4.

That is, when the error $V_E$ in Equation 4 is eliminated from Equation 3, the error $V_E$ will be eliminated from the voltage $V_{OUT}'$ of the second node nc2. Thus, in the error correction unit 24 of FIG. 7, the amplifier 25 having the gain $(C_1+C_3)/C_2$ multiplies the correction voltage $V_S$ in Equation 4 by $(C_1+C_3)/C_2$, and the adder 26 adds the output, $V_S \times (C_1+C_3)/C_2 = V_E \times C_1/C_2 + \text{constant}$, of the amplifier 25 and $V_{OUT}'$ in Equation 3 to obtain the following relation.

$$\begin{aligned}V_{OUT} &= V_{OUT}' + V_S \times (C_1 + C_3)/C_2 \quad \text{(Equation 5)}\\ &= (V_{IN} - V_E) \times C_1/C_2 + \text{constant} + \\ & \quad V_E \times C_1/C_2 + \text{constant}\\ &= V_{IN} \times C_1/C_2 + \text{constant}\end{aligned}$$

$V_{OUT}$ in Equation 5 is an output voltage that does not include the error $V_E$ and is proportional to the input voltage $V_{IN}$.

A preset circuit (switches $S_{1-1}$, $S_{1-2}$ and $S_2$) of the first node nc1 and a preset circuit (switch $S_{1-3}$) of the second node nc2 illustrated in FIG. 7 are not limited to this configuration, and the following modifications may be employed.

FIG. 9 is a diagram illustrating an example of a preset circuit of the first node nc1. Example 1 is the same as the circuit illustrated in FIG. 7. That is, in the preset period, the switch SW1 is turned on and the switch SW2 is connected to the ground to apply the input voltage $V_{IN}$ to the first node nc1 of the input-side capacitor $C_1$. At the start moment of charge transfer, the switch SW1 is turned off and the switch SW2 is connected to the bias voltage $V_{B1}$ to apply the voltage $V_{IN}+V_{B1}$ to the first node nc1.

In Example 2, in the preset period, the switch SW1 is turned on and the switch SW2 is connected to the ground to apply the bias voltage $V_{B1}$ to the first node nc1. At the start moment of charge transfer, the switch SW1 is turned off and the switch SW2 is connected to the input voltage $V_{IN}$ to apply the voltage $V_{IN}+V_{B1}$ to the first node nc1. In FIG. 7, the same circuit as Example 2 may be used.

FIG. 10 is a diagram illustrating an example of a preset circuit of the second node nc2. Example 1 is the same as the circuit illustrated in FIG. 7. That is, in the preset period, the switch SW3 is turned on to apply the bias voltage $V_{B2}$ on the output side to the second node nc2, and the switch SW3 is turned off at the start moment of charge transfer.

In Example 2, the bias voltage $V_{B2}$ on the output side is divided into $V_{B2\_1}$ and $V_{B2\_2}$ so that $V_{B2}=V_{B2\_1}+V_{B2\_2}$. In the preset period, the switch SW3 is turned on the switch SW4 is connected to the ground to apply the voltage $V_{B2\_1}$ to the second node nc2. At the start moment of charge transfer, the switch SW3 is turned off and the switch SW4 is connected to the voltage $V_{B2\_2}$ to apply the voltage $V_{B2}=V_{B2\_1}+V_{B2\_2}$ to the second node nc2. In FIG. 7, the same circuit as Example 2 may be used.

The preset circuit may have a configuration in which the first and second nodes are set to predetermined voltages in the preset period with the charge transfer element 21 maintained in the off state, and at the start moment of charge transfer, the charge transfer element 21 has a voltage of time t1 of FIG. 8 so that the charge transfer element 21 is in the on state.

[Modification of Present Embodiment]

Figure 11:
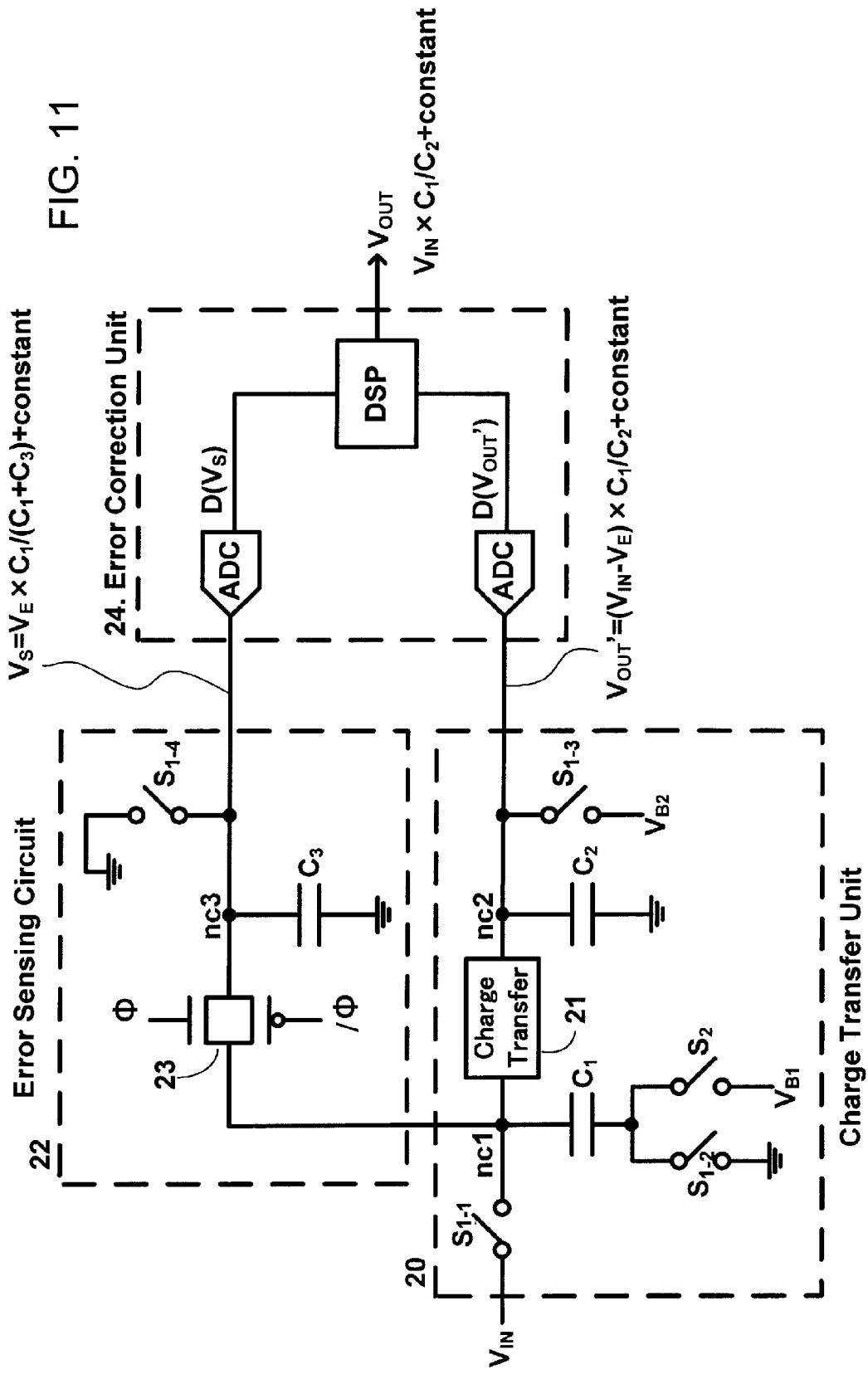
FIG. 11 is a diagram illustrating a modification of a charge transfer circuit according to the present embodiment.

FIG. 11 is a diagram illustrating a modification of a charge transfer circuit according to the present embodiment. A charge transfer unit 20 and an error sensing circuit 22 are the same as those of FIG. 7. An error correction unit 24 is configured as a digital signal processor DSP unlike the configuration of FIG. 7. Thus, the error correction unit 24 includes an A/D converter ADC that converts the analog voltage $V_{OUT}'$ of the second node nc2 to a digital signal and an A/D converter ADC that converts the analog voltage $V_S$ of the third node nc3 to a digital signal. The digital signal processor DSP performs the operation of Equation 5 on both digital signals $V_S$ and $V_{OUT}'$ input at the end of the charge transfer operation.

FIG. 12 is a diagram illustrating a modification of a charge transfer circuit according to the present embodiment. A charge transfer unit 20 and an error sensing circuit 22 are the same as those of FIG. 7. An error correction unit 24 is configured as a digital signal processor DSP unlike the configuration of FIG. 7. Further, the error correction unit 24 includes one A/D converter and one switch SW10 and uses one A/D converter ADC in a time-sharing manner unlike the configuration of FIG. 11. That is, at the end of the charge transfer operation, the switch SW10 is connected to the second node nc2 and the analog voltage $V_{OUT}'$ is converted to a digital signal which is input to and held in the DSP. After that, the switch SW10 is connected to the third node nc3, and the analog voltage $V_S$ is converted to a digital signal which is input to and held in the DSP. The DSP performs the operation of Equation 4 on the two input digital signals.

As described above, according to the charge transfer circuit of the present embodiment, even when the threshold voltage has a fluctuation and the offset voltage of an amplification circuit has a fluctuation, it is possible to eliminate an error resulting from the fluctuations.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A charge transfer circuit comprising:
   a charge transfer unit including an input charge holding element that is configured to hold an input charge, an output charge holding element that is configured to hold an output charge, and a charge transfer element that is provided between a first node of the input charge holding element and a second node of the output charge holding element and is configured to transfer the charge held by the input charge holding element to the output charge holding element;
   an error sensing circuit being configured to detect a third voltage corresponding to a first voltage of the first node when the charge transfer element finished transferring the charge from the input charge holding element to the output charge holding element; and
   an error correction unit being configured to correct a second voltage of the second node when the charge transfer finished based on the third voltage and eliminate an error included in the second voltage of the second node.

2. The charge transfer circuit according to claim 1, wherein
   the error sensing circuit includes an error charge holding element and a transfer gate connected between the first node and a third node of the error charge holding element, and
   when the charge transfer finished, the transfer gate enters a conduction state to distribute charges in the input charge holding element to the input charge holding element and the error charge holding element, and the third voltage is held in the third node.

3. The charge transfer circuit according to claim 1, wherein
   the charge transfer element in the charge transfer unit includes a MOS transistor that has a first source/drain terminal connected to the first node, a second source/drain terminal connected to the second node, and a gate, and
   a charge transfer voltage is applied to the gate during the charge transfer.

4. The charge transfer circuit according to claim 3, wherein
   before the start of the charge transfer, the input charge holding element is applied with an input voltage and holds a charge corresponding to the input voltage, at the start of the charge transfer, a first gate voltage is applied to the gate of the MOS transistor to put the MOS transistor into a conduction state so that the charge in the. input charge holding element is transferred to the output charge holding element, and at the end of the charge transfer, the MOS transistor into a non-conduction state whereby the charge transfer ends.

5. The charge transfer circuit, according to claim 1, wherein
   the charge transfer element in the charge transfer unit includes: a MOS transistor that has a first source/drain terminal connected to the first node, a second source/drain terminal connected to the second node, and a gate to which a gate control signal is supplied; and an amplifier that generates the gate control signal according to a potential of the first node.

6. The charge transfer circuit according to claim 5, wherein
   before the start of the charge transfer, the input charge holding element is applied with an input voltage and holds a charge corresponding to the input voltage, at the start of the charge transfer, a first constant voltage and the voltage of the first node are applied to inputs of the amplifier to put the MOS transistor into a conduction state so that the charge in the input charge holding element is transferred to the output charge holding element, and when the voltage of the first node reaches the first constant voltage, the MOS transistor enters a non-conduction state whereby the charge transfer ends.

7. The charge transfer circuit according to claim 1, wherein the error correction unit includes an operation circuit being configured to eliminate an error included in the third voltage from the second voltage when the charge transfer ends.

8. The charge transfer circuit according to claim 1, wherein the error correction unit includes: an analog-to-digital converter being configured to convert the second voltage and the third voltage at the time when the charge transfer finished into digital values; and a digital signal processor being configured to eliminate an error included in the digital value of the third voltage from the digital value of the second voltage.

9. The charge transfer circuit according to claim 1, wherein at the start of the charge transfer the charge transfer unit sets the first node to a voltage that is the sum of the input voltage and an input-side bias voltage and sets the second node to an output-side voltage.

* * * * *